(12) United States Patent
Feng et al.

(10) Patent No.: US 11,200,825 B2
(45) Date of Patent: Dec. 14, 2021

(54) SHIFT REGISTER UNIT WITH REDUCED TRANSISTOR COUNT AND METHOD FOR DRIVING THE SAME, GATE DRIVING CIRCUIT AND METHOD FOR DRIVING THE SAME, AND DISPLAY APPARATUS

(71) Applicants: Hefei BOE Joint Technology Co., Ltd., Anhui (CN); BOE Technology Group Co., Ltd., Beijing (CN)

(72) Inventors: Xuehuan Feng, Beijing (CN); Yongqian Li, Beijing (CN); Xing Zhang, Beijing (CN)

(73) Assignees: HEFEI BOE JOINT TECHNOLOGY CO., LTD., Hefei (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/767,230

(22) PCT Filed: Dec. 16, 2019

(86) PCT No.: PCT/CN2019/125666
§ 371 (c)(1),
(2) Date: May 27, 2020

(87) PCT Pub. No.: WO2020/168798
PCT Pub. Date: Aug. 27, 2020

(65) Prior Publication Data
US 2021/0166597 A1 Jun. 3, 2021

(30) Foreign Application Priority Data
Feb. 22, 2019 (CN) .......................... 201910135181.1

(51) Int. Cl.
*G09G 3/20* (2006.01)
*G11C 19/28* (2006.01)

(52) U.S. Cl.
CPC ............... *G09G 3/20* (2013.01); *G11C 19/28* (2013.01); *G09G 2310/0267* (2013.01); *G09G 2310/0286* (2013.01); *G09G 2310/08* (2013.01)

(58) Field of Classification Search
CPC ............................................. G09G 2310/0286
See application file for complete search history.

(56) References Cited

U.S. PATENT DOCUMENTS

| 9,530,520 B2 | 12/2016 | Xu |
| 9,847,067 B2 | 12/2017 | Li et al. |
| 9,990,897 B2 | 6/2018 | Pang |
| 10,210,789 B2 | 2/2019 | Li et al. |

(Continued)

FOREIGN PATENT DOCUMENTS

| CN | 103500551 A | 1/2014 |
| CN | 104835476 A | 8/2015 |

(Continued)

OTHER PUBLICATIONS

First Office Action, including Search Report, for Chinese Patent Application No. 201910135181.1, dated Jan. 3, 2020, 32 pages.

(Continued)

*Primary Examiner* — Laurence J Lee
(74) *Attorney, Agent, or Firm* — Westman, Champlin & Koehler, P.A.

(57) ABSTRACT

The present disclosure provides a shift register unit and a method for driving the same, a gate driving circuit and a method for driving the same, and a display apparatus. The shift register unit includes a first input sub-circuit to an $N^{th}$ input sub-circuit and a first output sub-circuit to an $N^{th}$ output sub-circuit. N is an integer greater than or equal to 2. For n=1, 2, . . . , N, an $n^{th}$ input sub-circuit is electrically coupled to an $n^{th}$ input signal terminal, a first level signal terminal and a pull-up node, and an $n^{th}$ output sub-circuit is (Continued)

electrically coupled to an $n^{th}$ clock signal terminal, the pull-up node and an $n^{th}$ output signal terminal.

19 Claims, 12 Drawing Sheets

(56) References Cited

U.S. PATENT DOCUMENTS

| | | | |
|---|---|---|---|
| 10,431,143 | B2 | 10/2019 | Zhang et al. |
| 10,825,539 | B2 | 11/2020 | Feng et al. |
| 2016/0027526 | A1 | 1/2016 | Xu |
| 2016/0358666 | A1 | 12/2016 | Pang |
| 2017/0178557 | A1 | 6/2017 | Li et al. |
| 2017/0178582 | A1* | 6/2017 | Li ............. G09G 3/3659 |
| 2017/0372664 | A1 | 12/2017 | He et al. |
| 2019/0088190 | A1 | 3/2019 | Zhang et al. |
| 2020/0035316 | A1 | 1/2020 | Feng et al. |
| 2020/0075113 | A1* | 3/2020 | Yuan ............. G11C 19/287 |
| 2020/0258464 | A1 | 8/2020 | Wang |

FOREIGN PATENT DOCUMENTS

| | | |
|---|---|---|
| CN | 104978943 A | 10/2015 |
| CN | 104978944 A | 10/2015 |
| CN | 205282052 U | 6/2016 |
| CN | 106683634 A | 5/2017 |
| CN | 108573667 A | 9/2018 |
| CN | 108682397 A | 10/2018 |
| CN | 108735162 A | 11/2018 |
| CN | 108806597 A | 11/2018 |
| CN | 108877636 A | 11/2018 |
| CN | 109920387 A | 6/2019 |
| KR | 20140079106 A | 6/2014 |

OTHER PUBLICATIONS

Second Office Action, including Search Report, for Chinese Patent Application No. 201910135181.1, dated Aug. 27, 2020, 30 pages.

* cited by examiner

SHIFT REGISTER UNIT WITH REDUCED TRANSISTOR COUNT AND METHOD FOR DRIVING THE SAME, GATE DRIVING CIRCUIT AND METHOD FOR DRIVING THE SAME, AND DISPLAY APPARATUS

CROSS-REFERENCE TO RELATED APPLICATION(S)

This application is a Section 371 National Stage Application of International Application No. PCT/CN2019/125666, filed on Dec. 16, 2019, which claims priority to the Chinese Patent Application No. 201910135181.1, filed on Feb. 22, 2019, entitled "SHIFT REGISTER UNIT AND METHOD FOR DRIVING THE SAME, GATE DRIVING CIRCUIT AND METHOD FOR DRIVING THE SAME, AND DISPLAY APPARATUS", the disclosures of which are incorporated herein by reference in their entireties.

TECHNICAL FIELD

The present disclosure relates to the field of display technology, and more particularly, to a shift register unit and a method for driving the same, a gate driving circuit, and a display apparatus.

BACKGROUND

In a Thin Film Transistor (TFT)-based Liquid Crystal Device (LCD) or Active Matrix Organic Light Emitting Display (AMOLED), a gate driving circuit which drives a gate may be formed on a display panel to constitute a Gate drive On Array (GOA). The gate driving circuit comprises a plurality of cascaded shift register units, and each of the shift register units comprises a plurality of TFTs to implement functions such as inputting, pulling-down and pulling-down control, outputting, resetting and de-noising etc., respectively. However, as requirements for parameters of a panel such as a resolution etc. continue to increase, a larger number of transistors have hindered the improvement of the panel.

SUMMARY

The present disclosure proposes a shift register unit and a method for driving the same, a gate driving circuit and a method for driving the same, and a display apparatus.

According to an aspect of the present disclosure, there is provided a shift register unit. The shift register unit comprises a first input sub-circuit to an $N^{th}$ input sub-circuit and a first output sub-circuit to an $N^{th}$ output sub-circuit which have one-to-one correspondence with the first input sub-circuit to the $N^{th}$ input sub-circuit, where N is an integer greater than or equal to 2. An $n^{th}$ input sub-circuit is electrically coupled to an $n^{th}$ input signal terminal, a first level signal terminal and a pull-up node, and is configured to transmit a first level signal at the first level signal terminal to the pull-up node under the control of an $n^{th}$ input signal at the $n^{th}$ input signal terminal. An $n^{th}$ output sub-circuit is electrically coupled to an $n^{th}$ clock signal terminal, the pull-up node, and an $n^{th}$ output signal terminal, and is configured to transmit an $n^{th}$ clock signal at the $n^{th}$ clock signal terminal to the $n^{th}$ output signal terminal under the control of a voltage at the pull-up node, where n=1, 2, ..., N.

In some embodiments, the shift register unit further comprises a first pull-down sub-circuit to an $N^{th}$ pull-down sub-circuit which have one-to-one correspondence with the first output sub-circuit to the $N^{th}$ output sub-circuit. An $n^{th}$ pull-down sub-circuit is electrically coupled to a pull-down node, a second level signal terminal and the $n^{th}$ output signal terminal, and is configured to transmit a second level signal at the second level signal terminal to the $n^{th}$ output signal terminal under the control of a voltage at the pull-down node.

In some embodiments, the shift register unit further comprises a control sub-circuit. The control sub-circuit is electrically coupled to the pull-up node, a second level signal terminal, a third level signal terminal, and a pull-down node, and is configured to transmit a second level signal at the second level signal terminal or a third level signal at the third level signal terminal to the pull-down node under the control of the voltage at the pull-up node.

In some embodiments, the shift register unit further comprises a first reset sub-circuit to an $N^{th}$ reset sub-circuit which have one-to-one correspondence with the first output sub-circuit to the $N^{th}$ output sub-circuit. An $n^{th}$ reset sub-circuit is electrically coupled to an $n^{th}$ reset signal terminal, a second level signal terminal, and the pull-up node, and is configured to transmit a second level signal at the second level signal terminal to the pull-up node under the control of an $n^{th}$ reset signal at the $n^{th}$ reset signal terminal.

In some embodiments, the shift register unit further comprises a general reset sub-circuit. The general reset sub-circuit is electrically coupled to a general reset signal terminal, a second level signal terminal and the pull-up node, and is configured to transmit a second level signal at the second level signal terminal to the pull-up node under the control of a general reset signal at the general reset signal terminal.

In some embodiments, the shift register unit further comprises an external compensation driving sub-circuit. The external compensation driving sub-circuit is electrically coupled to a compensation input signal terminal, a random output enabling signal terminal, a compensation clock signal terminal, a second level signal terminal and the pull-up node, and is configured to transmit a compensation clock signal at the compensation clock signal terminal to the pull-up node under the control of a random output enabling signal at the random output enabling signal terminal and the compensation clock signal.

In some embodiments, the $n^{th}$ input sub-circuit comprises an $n^{th}$ input transistor. The $n^{th}$ input transistor has a control electrode electrically coupled to the $n^{th}$ input signal terminal, a first electrode electrically coupled to the first level signal terminal, and a second electrode electrically coupled to the pull-up node.

In some embodiments, the $n^{th}$ output sub-circuit comprises an $n^{th}$ output transistor and an $n^{th}$ storage capacitor. The $n^{th}$ output transistor has a control electrode electrically coupled to the pull-up node, a first electrode electrically coupled to the $n^{th}$ clock signal terminal, and a second electrode electrically coupled to the $n^{th}$ output signal terminal. The $n^{th}$ storage capacitor has a first electrode electrically coupled to the pull-up node, and a second electrode electrically coupled to the $n^{th}$ output signal terminal.

In some embodiments, the $n^{th}$ pull-down sub-circuit comprises an $n^{th}$ pull-down transistor. The $N^{th}$ pull-down transistor has a control electrode electrically coupled to the pull-down node, a first electrode electrically coupled to the second level signal terminal, and a second electrode electrically coupled to the $n^{th}$ output signal terminal.

In some embodiments, the control sub-circuit comprises a first control transistor and a second control transistor. The first control transistor has a control electrode and a first electrode electrically coupled to the third level signal terminal, and a second electrode electrically coupled to the pull-down node. The second control transistor has a control electrode electrically coupled to the pull-up node, a first electrode electrically coupled to the second level signal terminal, and a second electrode electrically coupled to the pull-down node.

In some embodiments, the control sub-circuit further comprises a third control transistor. The third control transistor has a control electrode electrically coupled to the pull-down node, a first electrode electrically coupled to the second level signal terminal, and a second electrode electrically coupled to the pull-up node.

In some embodiments, the $n^{th}$ reset sub-circuit comprises an $n^{th}$ reset transistor. The $n^{th}$ reset transistor has a control electrode electrically coupled to the $n^{th}$ reset signal terminal, a first electrode electrically coupled to the second level signal terminal, and a second electrode electrically coupled to the pull-up node.

In some embodiments, the general reset sub-circuit comprises a general reset transistor. The general reset transistor has a control electrode electrically coupled to the general reset signal terminal, a first electrode electrically coupled to the second level signal terminal, and a second electrode electrically coupled to the pull-up node.

In some embodiments, the external compensation driving sub-circuit comprises a first compensation driving transistor, a second compensation driving transistor, a third compensation driving transistor, and a compensation driving capacitor. The first compensation driving transistor has a control electrode electrically coupled to the random output enabling signal terminal, a first electrode electrically coupled to the compensation input signal terminal, and a second electrode electrically coupled to a first electrode of the compensation driving capacitor. The second compensation driving transistor has a control electrode electrically coupled to the first electrode of the compensation driving capacitor, a first electrode electrically coupled to the compensation clock signal terminal, and a second electrode electrically coupled to a first electrode of the third compensation driving transistor. The third compensation driving transistor has a control electrode electrically coupled to the compensation clock signal terminal, and a second electrode electrically coupled to the pull-up node. A second electrode of the compensation driving capacitor is electrically coupled to the second level signal terminal.

According to another aspect of the present disclosure, there is provided a method for driving the shift register unit according to any of the above embodiments. Here, each frame comprises a first driving period to an $N^{th}$ driving period. The method comprises: during an $n^{th}$ driving period, performing driving through the $n^{th}$ input sub-circuit and the $n^{th}$ output sub-circuit, wherein the $n^{th}$ driving period comprises an $n^{th}$ input period and an $n^{th}$ output period. Specifically, during the $n^{th}$ input period, the pull-up node is charged to a first valid level through the $n^{th}$ input sub-circuit; and during the $n^{th}$ output period, the $n^{th}$ clock signal is transmitted to the $n^{th}$ output signal terminal under the control of the voltage at the pull-up node.

In some embodiments, each frame further comprises a blank period following the first driving period to the $N^{th}$ driving period. The method further comprises: during a random one of the first output period to the $N^{th}$ output period, turning the second compensation driving transistor on by a compensation input signal at the compensation input signal terminal under the control of a random output enabling signal; during the blank period, raising the pull-up node to a valid level by a compensation clock signal, so as to transmit a first clock signal to an $N^{th}$ clock signal to the first output signal terminal to the $N^{th}$ output signal terminal respectively; and causing one of the first clock signal to the $N^{th}$ clock signal to have a high level during at least a part of the blank period according to the random output enabling signal, to enable one of the first output signal terminal to the $N^{th}$ output signal terminal to output a high level signal during the blank period.

According to another aspect of the present disclosure, there is provided a gate driving circuit. The gate driving circuit comprises a plurality of cascaded shift register unit groups, each shift register unit group comprising K cascaded shift register units, wherein each of the shift register units is the shift register unit according to any of the above embodiments, where K is an integer greater than or equal to 3. K cascaded shift register units in each stage of shift register unit group are used to drive adjacent N×K gate lines, wherein the N×K gate lines comprise a first gate line group to an $N^{th}$ gate line group which are arranged in sequence, and each gate line group comprises K gate lines arranged in sequence, wherein $n^{th}$ output signal terminals in the K cascaded shift register units in each shift register unit group are electrically coupled to K gate lines in an $n^{th}$ gate line group in one-to-one correspondence respectively. Except for a first input signal terminal of a first stage of shift register unit in a first stage of shift register unit group, each input signal terminal is electrically coupled to an output signal terminal which is electrically coupled to a previous gate line of a gate line corresponding to the input signal terminal. The first input signal terminal of the first stage of shift register unit in the first stage of shift register unit group is electrically coupled to a frame start signal terminal.

In some embodiments, each stage of shift register unit group in the gate driving circuit is electrically coupled to a first clock signal line to an $(N \times K)^{th}$ clock signal line to receive a first clock signal to an $(N \times K)^{th}$ clock signal respectively. An $m^{th}$ clock signal line and an $m^{th}$ gate line among N×K gate lines driven by the shift register unit group are coupled to the same output sub-circuit, where m=1, 2, ..., N×K.

In some embodiments, except for an $N^{th}$ reset signal terminal of a last stage of shift register unit in a last stage of shift register unit group, each reset signal terminal is electrically coupled to an output signal terminal which is electrically coupled to a next gate line of a gate line driven by an output sub-circuit corresponding to the reset signal terminal. The $N^{th}$ reset signal terminal of the last stage of shift register unit in the last stage of shift register unit group is electrically coupled to the frame start signal terminal.

According to another aspect of the present disclosure, there is provided a method for driving the gate driving circuit according to any of the above embodiments. The method comprises: providing a frame start signal to the first input signal terminal in the first stage of shift register unit in the first stage of shift register unit group; and providing clock signals to clock signal terminals in each stage of shift register unit group through N×K clock signal lines, wherein a first edge of a clock signal provided through a first clock signal line among the N×K clock signal lines lags behind a first edge of the frame start signal by 1/N×K clock cycles during a first cycle.

In some embodiments, the first clock signal to the $(N \times K)^{th}$ clock signal have a duty ratio of 1/N×K, and sequentially lags behind by 1/N×K clock cycles.

According to another aspect of the present disclosure, there is provided a display apparatus. The display apparatus comprises the gate driving circuit according to any of the above embodiments.

BRIEF DESCRIPTION OF THE ACCOMPANYING DRAWINGS

In order to more clearly explain the technical solutions in the embodiments of the present disclosure or in the related art, the accompanying drawings needed to be used in the description of the embodiments will be briefly introduced below. Obviously, the accompanying drawings in the following description are only some embodiments of the present disclosure. Other accompanying drawings may be obtained by those of ordinary skill in the art according to these accompanying drawings without any creative effort. In the accompanying drawings:

FIG. 7 illustrates an exemplary circuit diagram of the shift register unit in

FIG. 6.

Figure 7:
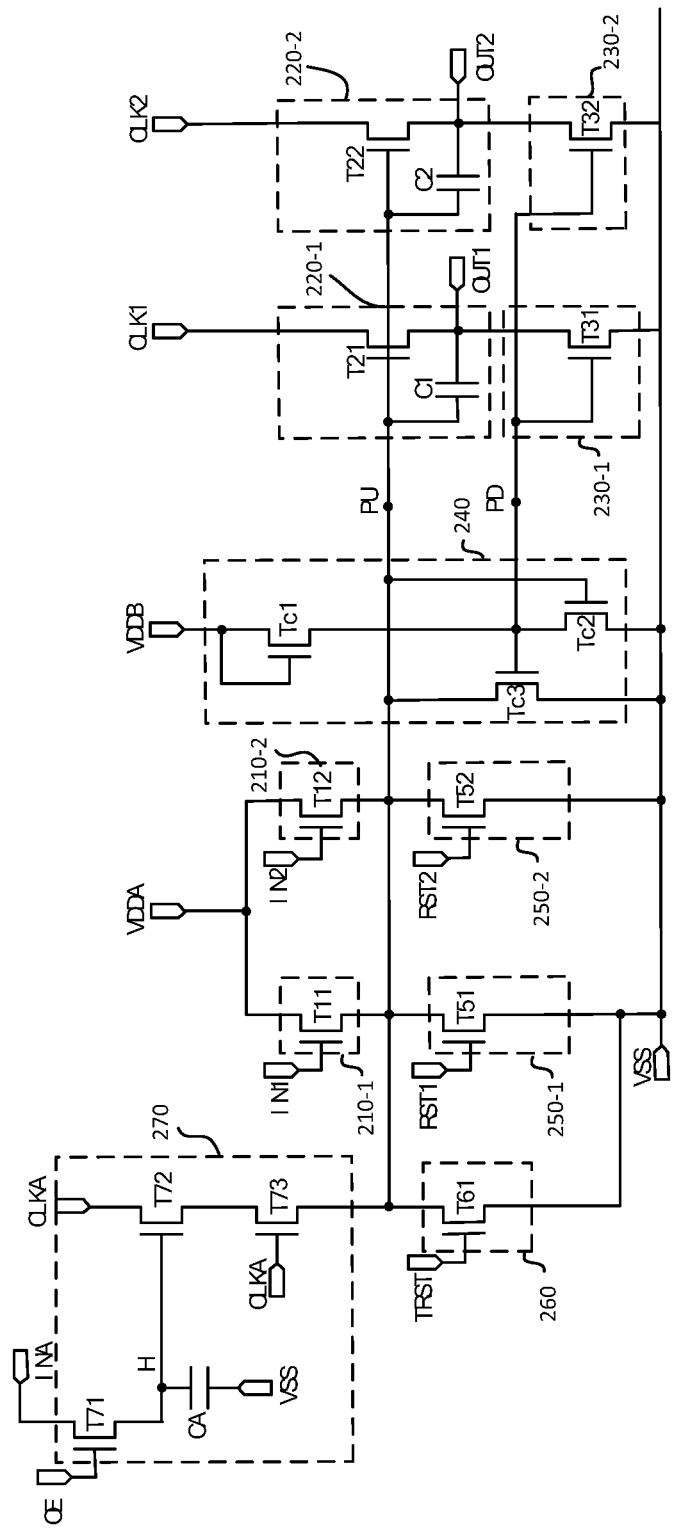
Figure 8:
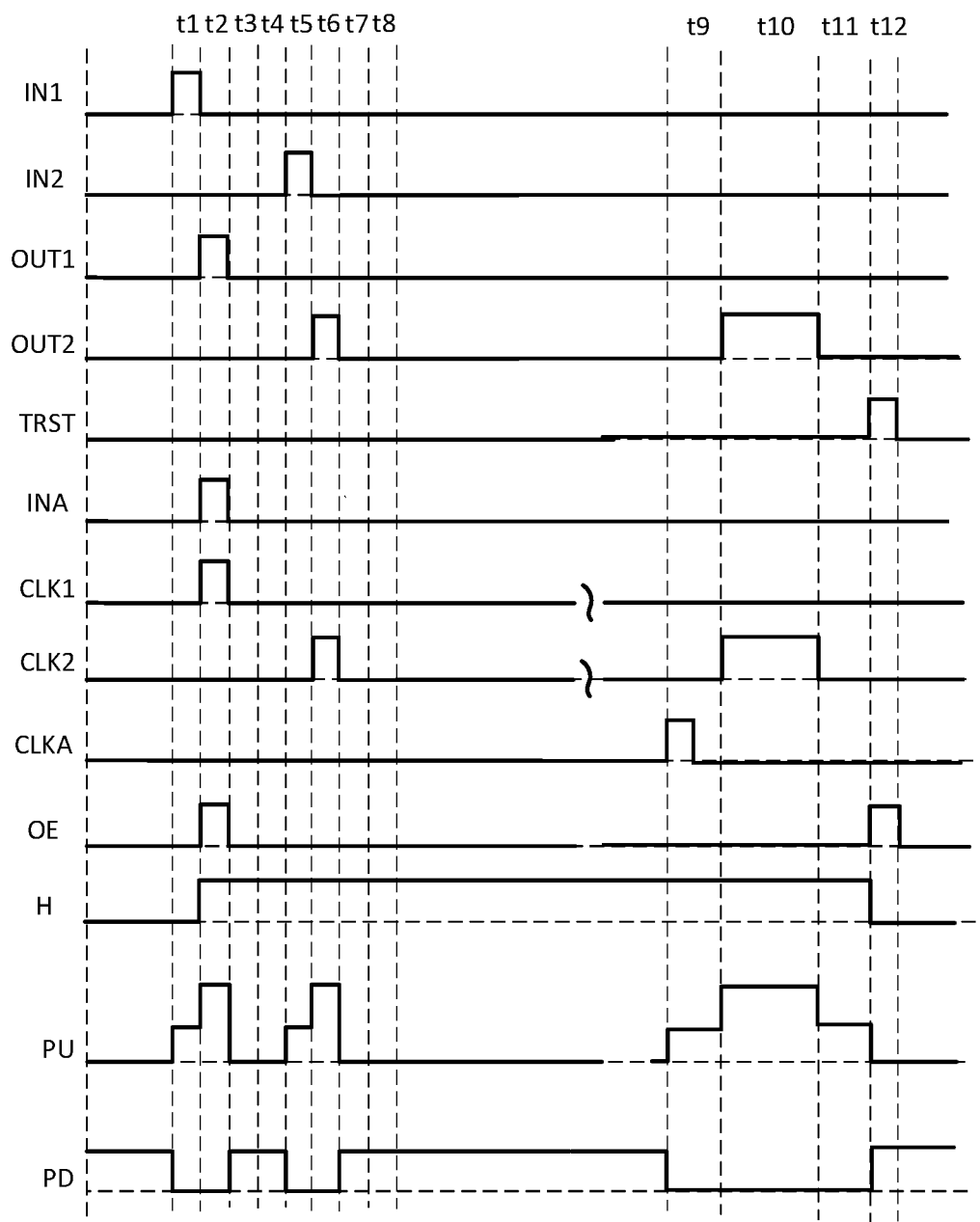

FIG. 8 illustrates a timing diagram of the shift register unit shown in FIG. 7.

Figure 9:
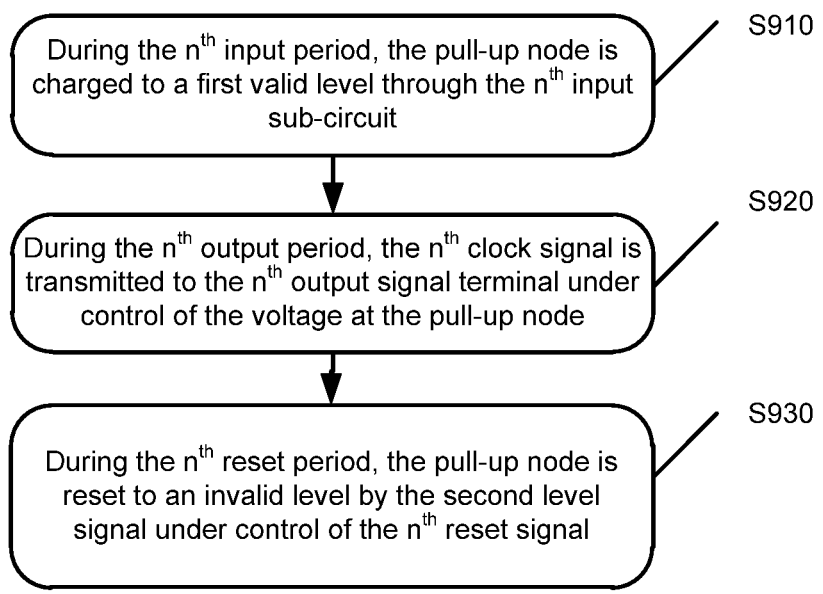

FIG. 9 illustrates a flowchart of a method for driving a shift register unit according to an embodiment of the present disclosure.

Figure 10:
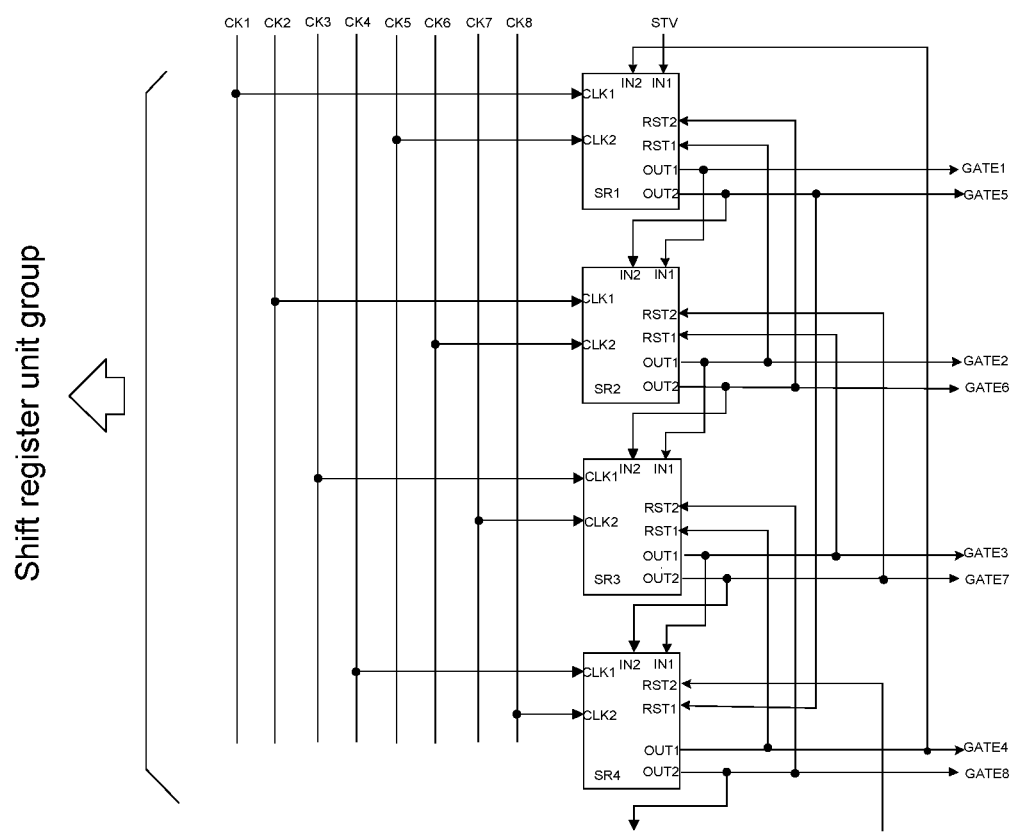

FIG. 10 illustrates a cascaded structural diagram of a gate driving circuit according to an embodiment of the present disclosure.

Figure 11:
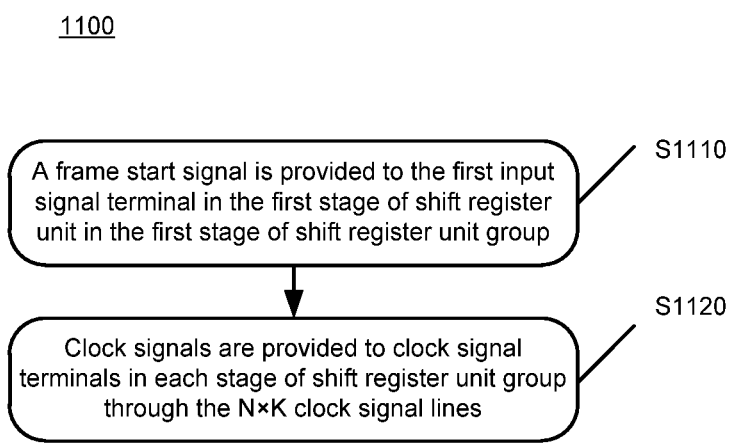

FIG. 11 illustrates a flowchart of a method for driving a gate driving circuit according to an embodiment of the present disclosure.

Figure 12:
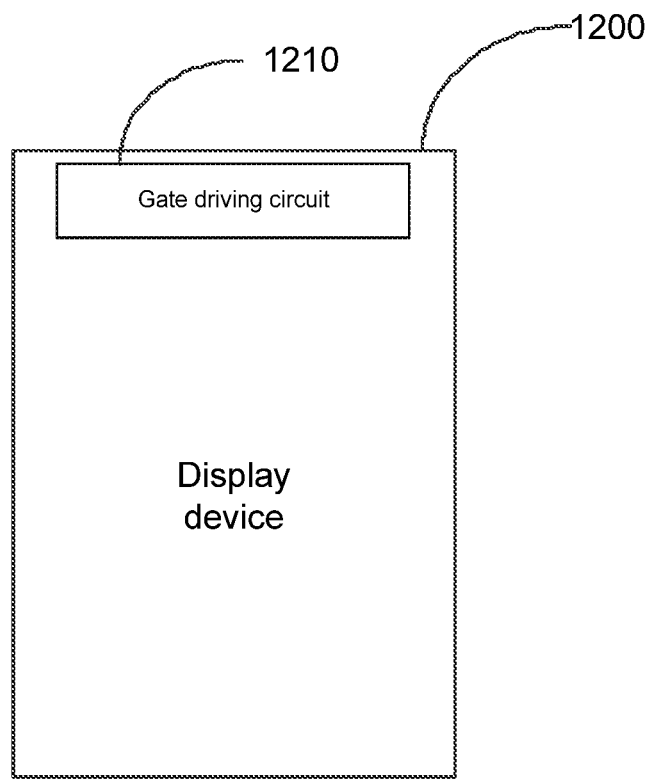

FIG. 12 illustrates a schematic block diagram of a display apparatus according to an embodiment of the present disclosure.

DETAILED DESCRIPTION

In order to make the purposes, technical solutions, and advantages of the embodiments of the present disclosure more clear, the technical solutions in the embodiments of the present disclosure will be described clearly and completely in conjunction with the accompanying drawings in the embodiments of the present disclosure. Obviously, the embodiments described are a part of the embodiments of the present disclosure, instead of all the embodiments of the present disclosure. All other embodiments obtained by those of ordinary skill in the art based on the described embodiments of the present disclosure without any creative effort fall within the protection scope of the present disclosure. It should be illustrated that throughout the accompanying drawings, the same elements are denoted by the same or similar reference signs. In the following description, some specific embodiments are for descriptive purposes only, and should not be construed as limiting the present disclosure, but are merely examples of the embodiments of the present disclosure. The conventional structure or configuration will be omitted when it may cause confusion to the understanding of the present disclosure. It should be illustrated that shapes and sizes of components in the figures do not reflect true sizes and proportions, but only illustrate contents of the embodiments of the present disclosure.

Unless otherwise defined, the technical terms or scientific terms used in the embodiments of the present disclosure should have a common meaning understood by those skilled in the art. The terms "first", "second" and similar words used in the embodiments of the present disclosure do not indicate any order, quantity or importance, but are only used to distinguish different components.

In addition, in the description of the embodiments of the present disclosure, the term "connected" or "electrically connected" may refer to that two components are directly connected or electrically connected, or may refer to that two components are connected or electrically connected via one or more other components. In addition, the two components may be connected or electrically connected in a wired or wireless manner.

Transistors used in the embodiments of the present disclosure may all be thin film transistors, field effect transistors, or other devices having the same characteristics. The transistors used in the embodiments of the present disclosure are mainly switching transistors according to their functions in a circuit. Each of the transistors used in the present disclosure comprises "a control electrode", "a first electrode" and "a second electrode". In an embodiment in which a thin film transistor is used, the control electrode refers to a gate of the thin film transistor, the first electrode refers to one of a source and a drain of the thin film transistor, and the second electrode refers to the other of the source and the drain of the thin film transistor. Since the source and the drain of the thin film transistor used here are symmetrical, the source and the drain may be interchanged. In the following examples, description will be made by taking N-type thin film transistors as an example. Similarly, in other embodiments, the technical solutions according to the present disclosure may also be implemented using P-type thin film transistors. It may be understood by those skilled in the art that in this case, the technical solutions according to the present disclosure may also be implemented by inverting (and/or performing other adaptive modifications to) input signals, clock signals, and constant voltage signals etc.

In the embodiments of the present disclosure, a clock signal is a periodic signal. In one cycle, the clock signal is divided into a high level period and a low level period appearing successively by two signal edges (a first edge and a second edge lagging behind the first edge). Further, in the description of the embodiments of the present disclosure, the terms "valid level" and "invalid level" are levels which turns a relevant transistor on and off respectively. In the present disclosure, "first valid level" and "second valid level" are only used to distinguish different amplitudes of the two valid levels. In the following, since an N-type thin film transistor is used as an example, the "valid level" is a high level and the "invalid level" is a low level.

The present disclosure will be described in detail below with reference to the accompanying drawings.

Figure 1:
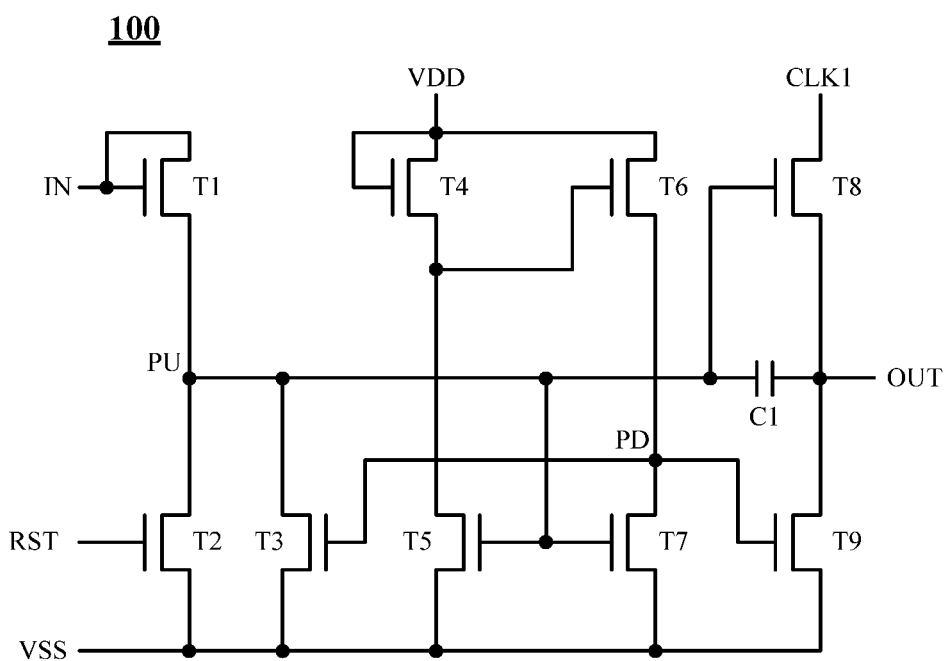
FIG. 1 illustrates a schematic circuit diagram of a shift register unit in the related art.

FIG. 1 illustrates a schematic circuit diagram of a shift register unit 100 in the related art. As shown in FIG. 1, a clock signal at a clock signal terminal CLK1 may provide a high level signal to an output signal terminal OUT through a thin film transistor T8 under the control of a pull-up node PU, and a signal at a constant voltage signal terminal VSS may provide a low level signal to the output signal terminal OUT through a thin film transistor T9 under the control of a pull-down node PD. Thus, a signal output at the output signal terminal OUT may be controlled by controlling a timing of potentials at the pull-up node PU and the pull-down node PD. In order to achieve proper control of a voltage at the pull-up node PU, during an input phase, the pull-up node PU is charged to a high level through the input transistor T1 by using an input signal; during a reset phase, the pull-up node PU is reset to a low level through a reset transistor T2 by using the low level signal at VSS; and a function of de-noising the pull-up node PU is further realized through a thin film transistor T3.

In addition, in order to achieve proper control of a voltage at the pull-down node PD, a high level signal at VDD and a low level signal at VSS are transmitted to the pull-down node PD respectively through a sub-circuit structure formed by thin film transistors T4, T5, T6 and T7. A final voltage at the pull-down node PD is determined by channel aspect ratios of T6 and T7. Appropriate setting of the voltage at the point PD may be achieved by appropriately setting the aspect ratios.

Thus, in order to control the output at the output signal terminal, a plurality of thin film transistors are used in the shift register unit 100 to implement functions such as inputting, resetting, de-noising, pulling-down control etc. respectively. The large number of thin film transistors will bring negative effect on improvement of performance of a panel in subsequent design.

Figure 2:
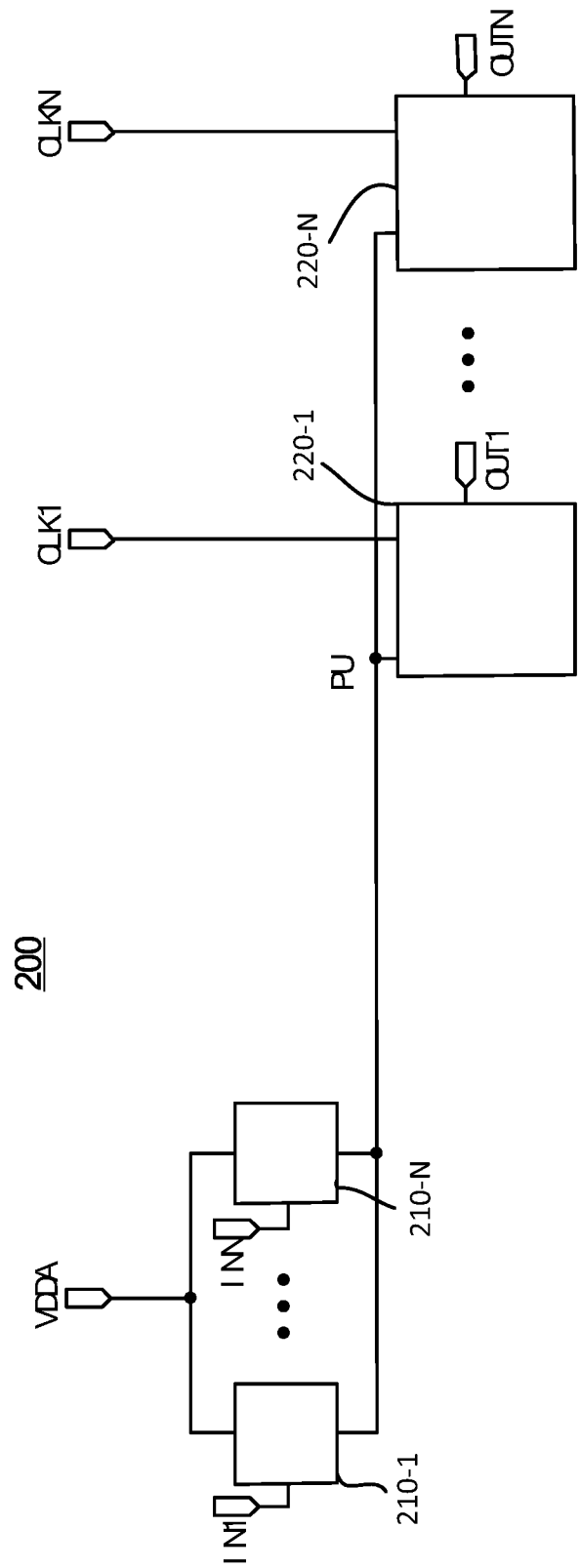
FIG. 2 illustrates a schematic structural diagram of a shift register unit according to an embodiment of the present disclosure.

FIG. 2 illustrates a schematic structural diagram of a shift register unit 200 according to an embodiment of the present disclosure.

As shown in FIG. 2, the shift register unit 200 comprises a first input sub-circuit 210-1 to an $N^{th}$ input sub-circuit 210-N, and a first output sub-circuit 220-1 to an $N^{th}$ output sub-circuit 220-N. The first output sub-circuit 210-1 to the $N^{th}$ output sub-circuit 210-N have one-to-one correspondence with the first input sub-circuit 220-1 to the $N^{th}$ input sub-circuit 220-N, where N is an integer greater than or equal to 2. The shift register unit 200 further has a first input signal terminal IN1 to an $N^{th}$ input signal terminal INN, a first output signal terminal OUT1 to an $N^{th}$ output signal terminal OUTN, a first clock signal terminal CLK1 to an $N^{th}$ clock signal terminal CLKN, and a first level signal terminal VDDA.

For any of 1 to N (that is, for n=1, 2, . . . , N), an $n^{th}$ input sub-circuit 210-$n$ is electrically coupled to an $n^{th}$ input signal terminal INn, the first level signal terminal VDDA, and a pull-up node PU. The $n^{th}$ input sub-circuit 210-$n$ is configured to transmit a first level signal at the first level signal terminal VDDA to the pull-up node PU under the control of an $n^{th}$ input signal at the $n^{th}$ input signal terminal INn.

An $n^{th}$ output sub-circuit 220-$n$ is electrically coupled to an $n^{th}$ clock signal terminal CLKn, the pull-up node PU, and an $n^{th}$ output signal terminal OUTn. The $n^{th}$ output sub-circuit 220-$n$ is configured to transmit an $n^{th}$ clock signal at the $n^{th}$ clock signal terminal CLKn to the $n^{th}$ output signal terminal OUTn under the control of a voltage at the pull-up node PU.

In other embodiments, for any of 1 to N (that is, for n=1, 2, . . . , N), the $n^{th}$ input sub-circuit 210-$n$ may not be electrically coupled to the first level signal terminal VDDA, and instead is only electrically coupled to the $n^{th}$ input signal terminal INn and the pull-up node PU. In such an embodiment, the $n^{th}$ input sub-circuit 210-$n$ is configured to transmit the $n^{th}$ input signal at the $n^{th}$ input signal terminal INn to the pull-up node PU under the control of the $n^{th}$ input signal.

Figure 3:
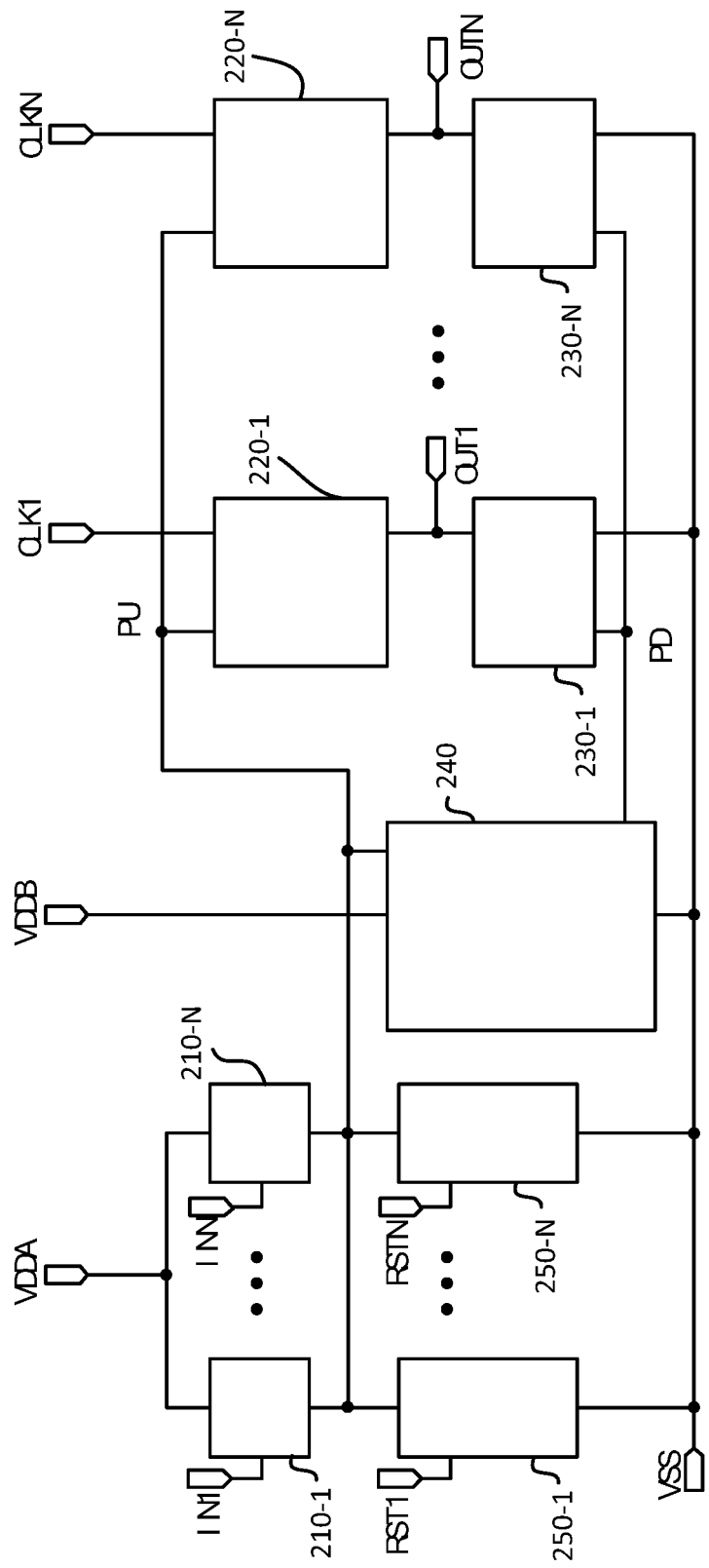
FIG. 3 illustrates a structural block diagram of a further embodiment of the shift register unit shown in FIG. 2.

FIG. 3 illustrates a structural block diagram of a further embodiment of the shift register unit 200 of FIG. 2.

As shown in FIG. 3, the shift register unit 200 further comprises a first pull-down sub-circuit 230-1 to an $N^{th}$ pull-down sub-circuit 230-N which have one-to-one correspondence with the first output sub-circuit 220-1 to the $N^{th}$ output sub-circuit 220-N.

An $n^{th}$ pull-down sub-circuit 230-$n$ is electrically coupled to a pull-down node PD, a second level signal terminal VSS, and an $n^{th}$ output signal terminal 220-$n$. The $n^{th}$ pull-down sub-circuit 230-$n$ is configured to transmit a second level signal at the second level signal terminal VSS to the $n^{th}$ output signal terminal 220-$n$ under the control of a voltage at the pull-down node PD.

In the embodiment shown in FIG. 3, the shift register unit 200 further comprises a control sub-circuit 240.

The control sub-circuit 240 is electrically coupled to the pull-up node PU, the second level signal terminal VSS, a third level signal terminal VDDB, and the pull-down node PD. The control sub-circuit 240 is configured to transmit the second level signal or a third level signal at the third level signal terminal VDDB to the pull-down node PD under the control of the voltage at the pull-up node PU.

In the embodiment shown in FIG. 3, the shift register unit 200 further comprises a first reset sub-circuit 250-1 to an $N^{th}$ reset sub-circuit 250-N which have one-to-one correspondence with the first output sub-circuit 220-1 to the $N^{th}$ output sub-circuit 220-N.

An $n^{th}$ reset sub-circuit 250-$n$ is electrically coupled to an $n^{th}$ reset signal terminal RSTn, the second level signal terminal VSS, and the pull-up node PU. The $n^{th}$ reset sub-circuit 250-$n$ is configured to transmit the second level signal to the pull-up node PU under the control of an $n^{th}$ reset signal at the $n^{th}$ reset signal terminal RSTn.

Figure 4:
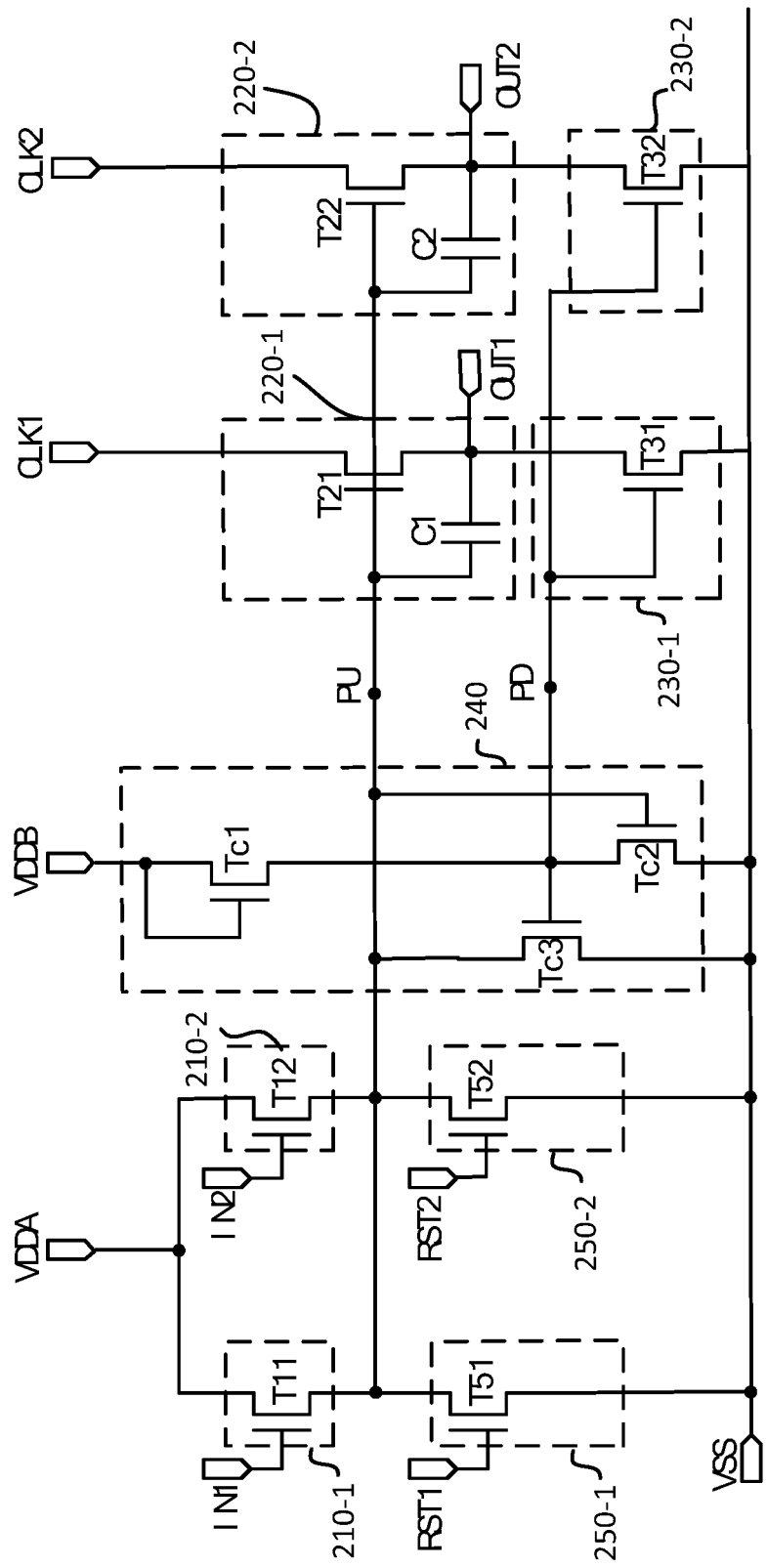
FIG. 4 illustrates an exemplary circuit diagram of the shift register unit shown in FIG. 3.

FIG. 4 illustrates an exemplary circuit diagram of the shift register unit 200 in FIG. 3. For convenience of explanation, only a circuit diagram with N being equal to 2 is shown in FIG. 4. It should be understood that the present disclosure is not limited thereto, and in other embodiments, N may be any integer greater than 2. Those skilled in the art may know a circuit structure and an operating flow thereof with N being another numerical value based on the following explanation and description.

As shown in FIG. 4, the first input sub-circuit 210-1 comprises a first input transistor T11. The first input transistor T11 has a control electrode electrically coupled to the first input signal terminal IN1, a first electrode electrically coupled to the first level signal terminal VDDA, and a second electrode electrically coupled to the pull-up node PU.

Similarly, the second input sub-circuit 210-2 comprises a second input transistor T12. The second input transistor T12 has a control electrode electrically coupled to the second input signal terminal IN2, a first electrode electrically coupled to the first level signal terminal VDDA, and a second electrode electrically coupled to the pull-up node PU.

In other embodiments, the first input transistor T11 and the second input transistor T12 may be in a diode connection manner. Specifically, the first input transistor T11 has a control electrode and a first electrode both electrically coupled to the first input signal terminal IN1, and a second electrode electrically coupled to the pull-up node PU. Similarly, the second input transistor T12 has a control electrode and a first electrode both electrically coupled to the second input signal terminal IN2, and a second electrode electrically coupled to the pull-up node PU.

The first output sub-circuit 220-1 comprises a first output transistor T21 and a first storage capacitor C1. The first output transistor T21 has a control electrode electrically coupled to the pull-up node PU, a first electrode electrically coupled to the first clock signal terminal CLK1, and a second electrode electrically coupled to the first output signal terminal OUT1. The first storage capacitor C1 has a first electrode electrically coupled to the pull-up node PU, and a second electrode electrically coupled to the first output signal terminal OUT1.

Similarly, the second output sub-circuit 220-2 comprises a second output transistor T22 and a second storage capacitor C2. The second output transistor T22 has a control electrode electrically coupled to the pull-up node PU, a first electrode electrically coupled to the second clock signal terminal CLK2, and a second electrode electrically coupled to the second output signal terminal OUT2. The second storage capacitor C2 has a first electrode electrically coupled to the pull-up node PU, and a second electrode electrically coupled to the second output signal terminal OUT2.

The first pull-down sub-circuit 230-1 comprises a first pull-down transistor T31. The first pull-down transistor T31 has a control electrode electrically coupled to the pull-down node PD, a first electrode electrically coupled to the second level signal terminal VSS, and a second electrode electrically coupled to the first output signal terminal OUT1.

Similarly, the second pull-down sub-circuit 230-2 comprises a second pull-down transistor T32. The second pull-down transistor T32 has a control electrode electrically coupled to the pull-down node PD, a first electrode electrically coupled to the second level signal terminal VSS, and a second electrode electrically coupled to the second output signal terminal OUT2.

The control sub-circuit 240 comprises a first control transistor Tc1 and a second control transistor Tc2. The first control transistor Tc1 has a control electrode and a first electrode electrically coupled to the third level signal terminal VDDB, and a second electrode electrically coupled to the pull-down node PD. The second control transistor Tc2 has a control electrode electrically coupled to the pull-up node PU, a first electrode electrically coupled to the second level signal terminal VSS, and a second electrode electrically coupled to the pull-down node PD.

In some embodiments (as shown in FIG. 4), the control sub-circuit 240 further comprises a third control transistor Tc3. The third control transistor Tc3 has a control electrode electrically coupled to the pull-down node PD, a first electrode electrically coupled to the second level signal terminal VSS, and a second electrode electrically coupled to the pull-up node PU.

The first reset sub-circuit 250-1 comprises a first reset transistor T51. The first reset transistor T51 has a control electrode electrically coupled to a first reset signal terminal RST1, a first electrode electrically coupled to the second level signal terminal VSS, and a second electrode electrically coupled to the pull-up node PU.

Similarly, the second reset sub-circuit 250-2 comprises a second reset transistor T52. The second reset transistor T52 has a control electrode electrically coupled to a second reset signal terminal RST2, a first electrode electrically coupled to the second level signal terminal VSS, and a second electrode electrically coupled to the pull-up node PU.

Figure 5:
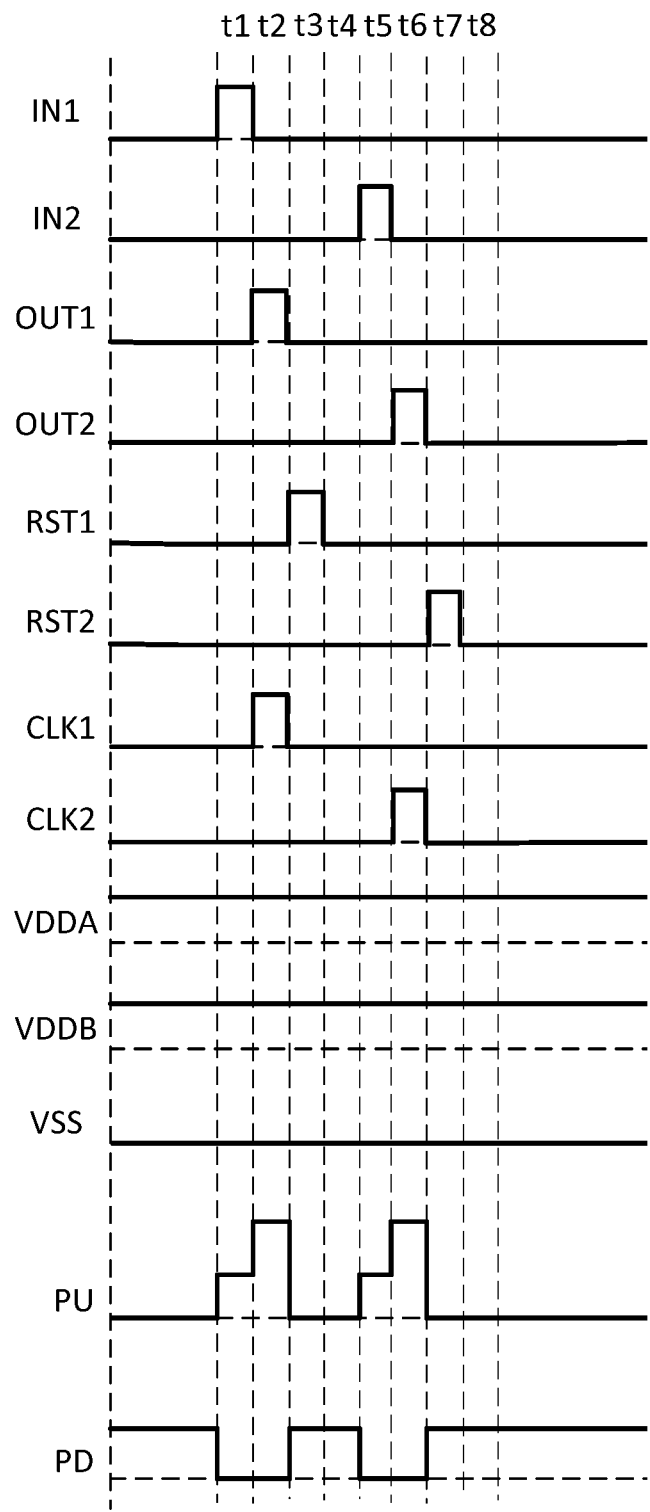
FIG. 5 illustrates a timing diagram of the shift register unit shown in FIG. 4.

FIG. 5 illustrates a timing diagram of the shift register unit 200 shown in FIG. 4. An operating flow of the shift register unit 200 in FIG. 4 will be described below with reference to FIG. 5.

According to the timing diagram in FIG. 5, one clock cycle is equally divided into 8 periods. A clock signal at the second clock signal terminal CLK2 lags behind a clock signal at the first clock signal terminal CLK1 by 4 periods, that is, a half of the clock cycle; a signal at the second input signal terminal IN2 lags behind a clock signal at the first input signal terminal IN1 by 4 periods, and a signal at the second reset signal terminal RST2 lags behind a signal at the first reset signal terminal RST1 by 4 periods. It should be illustrated that in the timing diagram of FIG. 5, signals at the first level signal terminal VDDA and the third level signal terminal VDDB are both shown as constant high level signals. In other embodiments, only VDDB is set, and the first input transistor T11 and the second input transistor T12 are implemented as having a diode connection. At this time, the first input signal terminal IN1 and the second input signal terminal IN2 play the role of VDDA.

Before a period t1, no input signal is input at the first input signal terminal IN1 and the second input signal terminal IN2 of the shift register unit 200, that is, the shift register unit 200 starts to operate during the period t1.

During the period t1, the signal at the input signal terminal IN1 changes from a low level (for example, vgl) to a high level (for example, vgh), to turn the first input transistor T11 on. At this time, a high level signal at the first level signal terminal VDDA is transmitted to the pull-up node PU, to pull up a voltage at the pull-up node PU to a first valid level, that is, a high level vgh. Both the first output transistor T21 and the second output transistor T22 are turned on under the action of the high level signal at the pull-up node PU, but at this time, the first clock signal terminal CLK1 and the second clock signal terminal CLK2 still maintain at a low level vgl, and therefore, the first output signal terminal OUT1 and the second output signal terminal OUT2 receive low level signals from the first clock signal terminal CLK1 and the second clock signal terminal CLK2.

It should be illustrated that in the circuit structure in which the third control transistor Tc3 (used to de-noise the PU after resetting) is provided, before the beginning of the period t1, since the third constant voltage signal terminal VDDB provides a high level signal to the control electrode and the first electrode of the first control transistor Tc1 all the time, the high level signal at VDDB causes a level at the point PD to be maintained at a high level, which turns the third transistor Tc3 on, and thus a low level signal at VSS causes PU to be maintained at a low level before t1. A channel aspect ratio of the first input transistor T11 and a channel aspect ratio of the third transistor Tc3 may be set so that the high level signal at VDDA may pull up the point PU.

The second control transistor Tc2 is turned on under the action of the high level signal at PU, and the low level signal at the second level signal terminal VSS may be transmitted to the pull-down node PD. On the other hand, as described above, the third level signal terminal VDDB provides a high level signal to the pull-down node PD. In this case, the pull-down node PD may finally be set to a low level signal according to setting of channel aspect ratios of Tc1 and Tc2. Thereby, the low level signal at the pull-down node PD turns the first pull-down transistor T31 and the second pull-down transistor T32 off.

At this time, output signals at the first output signal terminal OUT1 and the second output signal terminal OUT2 are both low level signals.

During a period t2, the signal at the first clock signal terminal CLK1 becomes a high level, the second clock signal terminal CLK2 is maintained at a low level, and the signal at the first input signal terminal IN1 becomes a low level. The high level of the signal at the first clock signal terminal CLK1 causes the first output signal terminal OUT1 to receive a high level signal. Since the low level signal at the first input signal terminal IN1 turns the first input transistor T11 off, the pull-up node PU is floated. The voltage at the point PU is further raised to a second valid level, for example, 2vgh, under bootstrap effect of the first capacitor C1. In addition, since the second clock signal terminal CLK2 still outputs a low level signal, the second output signal terminal OUT2 remains receiving a low level signal.

At this time, the first pull-down transistor T31 and the second pull-down transistor T32 are turned off. Therefore, the first output signal terminal OUT1 outputs a high level signal and the second output signal terminal OUT2 outputs a low level signal.

During a period t3, the signal at the first clock signal terminal CLK1 becomes a low level, the signal at the second clock signal terminal CLK2 remains at a low level, and the signal at the first reset signal terminal RST1 becomes a high level. The first reset transistor T51 is turned on under the action of the first reset signal at a high level, to pull down the pull-up node PU to a low level to realize resetting of the point PU, which turns the first output transistor T21 and the second transistor T22 off. In addition, the point PU is reset to turn the second control transistor Tc2 off, which results in that the pull-down node PD becomes a high level under the action of the signal at VDDB. Thereby, both the first pull-down transistor T31 and the second pull-down transistor T32 are turned on, to further transmit the low level signal at VSS to the first output signal terminal OUT1 and the second output signal terminal OUT2, so that both the first output signal terminal OUT1 and the second output signal terminal OUT2 output a low level.

During a period t4, the signal at the first clock signal terminal CLK1 and the signal at the second clock signal terminal CLK2 maintain at a low level, and the signal at the first reset signal terminal RST1 becomes a low level. The point PD has become a high level during the period t3, and thus, in an embodiment where the third control transistor Tc3 is provided, the low level signal at VSS causes the point PU to be de-noised through the third control transistor Tc3.

During a period t5, the signal at the input signal terminal IN2 changes from a low level (for example, vgl) to a high level (for example, vgh), to turn the second input transistor T12 on. At this time, the high level signal at the first level signal terminal VDDA is transmitted to the pull-up node PU, to pull up the voltage at the pull-up node PU to the first valid level, that is, the high level vgh. Both the first output transistor T21 and the second output transistor T22 are turned on under the action of the high level signal at the pull-up node PU, but at this time, the first clock signal terminal CLK1 and the second clock signal terminal CLK2 still provide a signal of the low level vgl. Therefore, the first output signal terminal OUT1 and the second output signal terminal OUT2 receive low level signals from the first clock signal terminal CLK1 and the second clock signal terminal CLK2.

It should be illustrated that, in the circuit structure in which the third control transistor Tc3 is provided, during the period t4, the low level signal at VSS continues de-noising PU, so that PU is at a low level. The channel aspect ratio of the second input transistor T12 and the channel aspect ratio of the third transistor Tc3 may be set so that the high level signal at VDDA may pull up the point PU.

The second control transistor Tc2 is turned on under the action of the high level signal at PU, and the low level signal at the second level signal terminal VSS may be transmitted to the pull-down node PD. On the other hand, as described above, the third level signal terminal VDDB provides a high level signal to the pull-down node PD. In this case, the pull-down node PD may finally be set to a low level according to setting of channel aspect ratios of Tc1 and Tc2. Thereby, the low level signal at the pull-down node PD turns the first pull-down transistor T31 and the second pull-down transistor T32 off.

At this time, the output signals at the first output signal terminal OUT1 and the second output signal terminal OUT2 are both low level signals.

During a period t6, the signal at the second clock signal terminal CLK2 becomes a high level, the signal at the first clock signal terminal CLK1 maintains at a low level, and the signal at the second input signal terminal IN2 becomes a low level. The high level signal at the second clock signal terminal CLK2 causes the second output signal terminal OUT2 to receive a high level signal. Since the low level signal at the second input signal terminal IN2 turns the second input transistor T12 off, the pull-up node PU is floated. The voltage at the point PU may be further raised to a second valid level, for example, 2vgh, under bootstrap effect of the second capacitor C2. In addition, since the first clock signal terminal CLK1 still outputs a low level signal, the first output signal terminal OUT1 continues receiving a low level signal.

At this time, the first pull-down transistor T31 and the second pull-down transistor T32 are turned off. Therefore, the first output signal terminal OUT1 outputs a low level signal and the second output signal terminal OUT2 outputs a high level signal.

During a period t7, the signal at the second clock signal terminal CLK2 becomes a low level, the signal at the first clock signal terminal CLK1 maintains at a low level, and the signal at the second reset signal terminal RST2 becomes a high level. The second reset transistor T52 is turned on under the action of the second reset signal at a high level, to pull down the pull-up node PU to a low level to realize the resetting of the point PU, which turns the first output transistor T21 and the second output transistor T22 off. In addition, the point PU is reset to turn the second control transistor Tc2 off, which results in that the pull-down node PD becomes a high level under the action of the signal at VDDB. Thereby, both the first pull-down transistor T31 and the second pull-down transistor T32 are turned on, to further transmit the low level signal at VSS to the first output signal terminal OUT1 and the second output signal terminal OUT2, so that both the first output signal terminal OUT1 and the second output signal terminal OUT2 output a low level signal.

During a period t8, the signal at the first clock signal terminal CLK1 and the signal at the second clock signal terminal CLK2 maintain at a low level, and the signal at the second reset signal terminal RST2 becomes a low level. The point PD has become a high level during the period t7, and thus, in the embodiment where the third control transistor Tc3 is provided, the low level signal at VSS causes the point PU to be de-noised through the third control transistor Tc3.

It should be illustrated that the timing in FIG. 5 is only exemplary, and in other embodiments, the shift register unit 200 may also operate according to other timings. For example, in another timing, one clock cycle may be divided into 6 periods, the clock signal at the second clock signal terminal CLK2 lags behind the clock signal at the first clock signal terminal CLK1 by 3 periods, that is, a half of the clock cycle; the signal at the second input signal terminal IN2 lags behind the clock signal at the first input signal terminal IN1 by 3 periods, and the signal at the second reset signal terminal RST2 lags behind the signal at the first reset signal terminal RST1 by 3 periods. In this timing, there will be no periods corresponding to t4 and t8 in FIG. 5.

Similarly, in another timing, one clock cycle may be generally divided into 2 k periods (where k is an integer greater than 4), the clock signal at the second clock signal terminal CLK2 lags behind the clock signal at the first clock signal terminal CLK1 by k periods, that is, a half of the clock period; the signal at the second input signal terminal IN2 lags behind the clock signal at the first input signal terminal IN1 by k periods, and the signal at the second reset signal terminal RST2 lags behind the signal at the first reset signal terminal RST1 by k periods. In this timing, periods t4 and t8 may cover a number k−3 of consecutive periods respectively.

Figure 6:
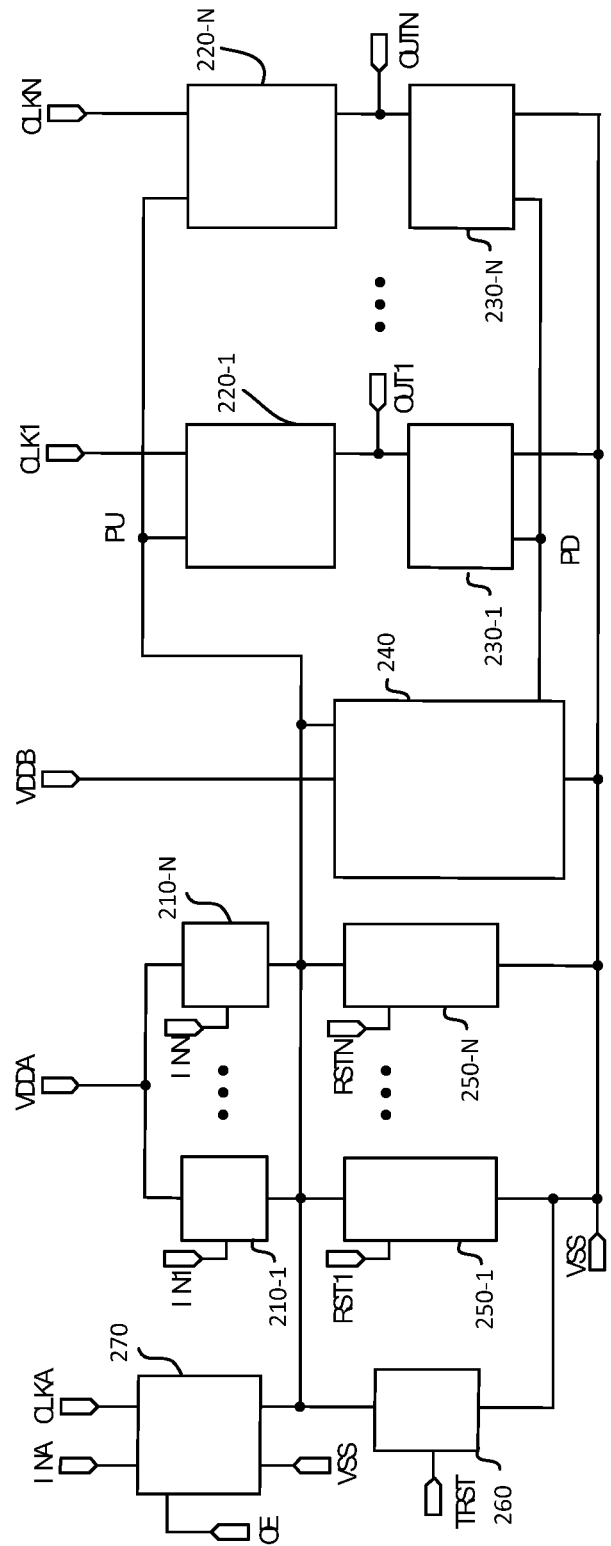
FIG. 6 illustrates a structural block diagram of a further embodiment of the shift register unit shown in FIG. 3.

FIG. 6 illustrates a structural block diagram of a further embodiment of the shift register unit 200 shown in FIG. 3. Compared with the structure in FIG. 3, the shift register unit in FIG. 6 further comprises a general reset sub-circuit 260 and an external compensation driving sub-circuit 270.

The general reset sub-circuit 260 is electrically coupled to a general reset signal terminal TRST, the second level signal terminal VSS, and the pull-up node PU. The general reset sub-circuit 260 is configured to transmit the second level signal to the pull-up node PU under the control of a general reset signal at the general reset signal terminal TRST.

The external compensation driving sub-circuit 270 is electrically coupled to a compensation input signal terminal INA, a random output enabling signal terminal OE, a compensation clock signal terminal CLKA, the second level signal terminal VSS, and the pull-up node PU. The external compensation driving sub-circuit 270 is configured to transmit a compensation clock signal at the compensation clock signal terminal CLKA to the pull-up node PU under the control of a random output enabling signal at the random output enabling signal terminal OE and the compensation clock signal.

FIG. 7 illustrates an exemplary circuit diagram of the shift register unit in FIG. 6. For convenience of explanation, only a circuit diagram with N being equal to 2 is shown in FIG. 6. It should be understood that the present disclosure is not limited thereto, and in other embodiments, N may be any integer greater than 2. Those skilled in the art may know a circuit structure and an operating flow thereof with N being another numerical value based on the following explanation and description.

As shown in FIG. 7, the general reset sub-circuit 260 comprises a general reset transistor T61. The general reset transistor T61 has a control electrode electrically coupled to the general reset signal terminal TRST, a first electrode electrically coupled to the second level signal terminal VSS, and a second electrode electrically coupled to the pull-up node PU.

The external compensation driving sub-circuit 270 comprises a first compensation driving transistor T71, a second compensation driving transistor T72, a third compensation driving transistor T73, and a compensation driving capacitor CA. The first compensation driving transistor T71 has a control electrode electrically coupled to the random output enabling signal terminal OE, a first electrode electrically coupled to the compensation input signal terminal INA, and a second electrode electrically coupled to a first electrode of the compensation driving capacitor CA at a node H.

The second compensation driving transistor T72 has a control electrode electrically coupled to the node H, a first electrode electrically coupled to the compensation clock signal terminal CLKA, and a second electrode electrically coupled to a first electrode of the third compensation driving transistor T73.

The third compensation driving transistor T73 has a control electrode electrically coupled to the compensation clock signal terminal CLKA, and a second electrode electrically coupled to the pull-up node PU.

A second electrode of the compensation driving capacitor CA is electrically coupled to the second level signal terminal VSS.

FIG. 8 illustrates a timing diagram of the shift register unit shown in FIG. 7. An operating flow of the shift register unit in FIG. 7 will be described below with reference to FIG. 8. As may be seen from FIG. 8, one frame is divided into two phases, i.e., a display phase and a blank phase. The display phase comprises t1 to t8, and the blank phase comprises t9 to t11. A timing of each of the input sub-circuit, the output sub-circuit, the pull-down sub-circuit, the control sub-circuit and the reset sub-circuit during the display phase is the same as that in FIG. 5, and thus only the operations of the general reset sub-circuit 260 and the external compensation driving sub-circuit 270 will be described below.

The general reset sub-circuit 260 only operates during t12. The general reset transistor T61 is turned on by changing a signal at the general reset signal terminal TRST to a high level, and thus, PU is reset by the signal at VSS. It should be illustrated that all shift register units in a gate driving circuit where the shift register unit shown in FIG. 7 is located share the same TRST, and therefore, during t12, general resetting is performed on all the shift register units in the gate driving circuit.

The external compensation driving sub-circuit 270 starts to operate at the period t2. During the period t2, the compensation input signal terminal INA starts to receive a high level signal, and the random output enabling signal terminal OE inputs a high level signal. The first compensation driving transistor T71 is turned on under the action of the high level signal at OE, to raise the node H to a high level. Therefore, the second compensation driving transistor T72 is turned on to transmit the signal at CLKA to the first electrode of the third compensation driving transistor T73. At this time, a signal at CLKA is at a low level, the third compensation driving transistor T73 is turned off, and the signal at CLKA may not be transmitted to the pull-up node PU.

During the subsequent periods t3 to t8, the compensation input signal terminal INA receives a low level signal, and the random output enabling signal terminal OE inputs a low level signal, so that T71 is turned off, the node H maintains at a high level, and T72 continues to be on.

During t9, the signal at CLKA becomes a high level, to cause the third compensation driving transistor T73 to be turned on. At this time, the high level signal at CLKA causes the point PU to be pulled up to the first valid level, for example, the high level vgh, which causes both the first output transistor T21 and the second output transistor T22 to be turned on. However, at this time, the signals at the first clock signal terminal CLK1 and the second clock signal terminal CLK2 are both at a low level, and therefore, the outputs at the first output signal terminal OUT1 and the second output signal terminal OUT2 are both at a low level.

During t10, the signal at CLKA is at a low level, the signal at CLK2 becomes a high level, and the signal at CLK1 maintains at a low level. The point PU is in a floating state. Due to the bootstrap effect, the level at the point PU is raised to the second valid level, for example, a high level of 2vgh. At this time, due to the high level signal at CLK2, the second output signal terminal OUT2 outputs a high level output signal.

During t11, the signal at CLK2 changes from a high level to a low level, and the output of the high level output signal at the second output signal terminal OUT2 ends.

During t12, in addition to resetting PU by the signal at TRST, the node H is also reset by the low level signal at INA by changing the signal at the OE to a high level. At this point, the operation of one frame ends.

It should be illustrated that the high level signal output at OUT2 during t10 is used to cause a switching transistor in a pixel circuit which controls external compensation to be turned on, so that external compensation may be performed on each pixel in a pixel row corresponding to OUT2. Since a phase of the signal at OE is randomly determined by a timing controller, in each frame, the signal at OE is randomly synchronized with a signal at a compensation input signal terminal INA of a certain one of all the shift register units in the gate driving circuit, which enables the point PU in the shift register unit to be pulled up during the blank phase, so as to realize output of a high level signal at OUT2 during the blank phase, thereby achieving external compensation. Of course, in order to achieve the output of the high level signal at OUT2, a clock signal terminal (i.e., CLK2) corresponding thereto also needs to have a high level during a part of the blank period (i.e., the period t10), which may be set by the timing controller after the signal at OE is randomly generated.

Thus, in the shift register unit shown in FIG. 7, the external compensation is not performed progressively, and instead is performed randomly according to the signal at OE which is generated randomly, which may eliminate the effect of a scanning line which moves progressively on the display effect.

FIG. 9 illustrates a flowchart of a method 900 for driving a shift register unit according to an embodiment of the present disclosure. The method 900 may be used to drive the shift register unit shown in FIGS. 2 to 4 and FIGS. 6 to 7. According to the above description, one frame comprises a display phase and a blank phase. During the display phase, corresponding gate lines are sequentially driven through respective output signal terminals in the shift register unit during different driving periods. Therefore, the display phase may comprise a first driving period to an $N^{th}$ driving period. For example, in the above embodiment, for the case where N=2 as shown in FIG. 5, t1 to t4 may correspond to a first driving period, and t5 to t8 may correspond to a second driving period.

During an $n^{th}$ driving period, a corresponding gate line is driven through the $n^{th}$ input sub-circuit, the $n^{th}$ output sub-circuit, and the $n^{th}$ reset sub-circuit, wherein the $n^{th}$ driving period may be further divided into an $n^{th}$ input period, an $n^{th}$ output period and an $n^{th}$ reset period. For example, for the case where N=2 as shown in FIG. 5, the first driving period comprises a first input period t1, a first output period t2, and a first reset period t3.

Specifically, in step S910, during the $n^{th}$ input period, the pull-up node is charged to a first valid level (for example, vgh) through the $n^{th}$ input sub-circuit.

In step S920, during the $n^{th}$ output period, the $n^{th}$ clock signal is transmitted to the $n^{th}$ output signal terminal under the control of the voltage at the pull-up node.

In step S930, during the $n^{th}$ reset period, the pull-up node is reset to an invalid level (for example, vgl) by the second level signal under the control of the $n^{th}$ reset signal.

In some embodiments, the method further comprises:

during a random one of the first output period to the $N^{th}$ output period, turning the second compensation driving transistor on by the compensation input signal at the compensation input signal terminal under the control of the random output enabling signal;

during the blank period, raising the pull-up node to a valid level by the compensation clock signal, to enable the first clock signal to the $N^{th}$ clock signal to be transmitted to the first output signal terminal to the $N^{th}$ output signal terminal respectively; and causing one of the first clock signal to the $N^{th}$ clock signal to have a high level during at least a part of the blank period according to the random output enabling signal, to enable one of the first output signal terminal to the $N^{th}$ output signal terminal to output a high level signal during the blank period.

It should be understood that the driving method 900 may be used to drive the shift register unit as described in the above embodiments. Therefore, the above explanation and description are also applicable here, and will not be repeated.

The gate driving circuit according to the embodiment of the present disclosure comprises a plurality of cascaded shift register unit groups, and each shift register unit group comprises K cascaded shift register units, wherein each of the shift register units is the shift register unit according to any of the above embodiments, where K is an integer greater than or equal to 3.

FIG. 10 illustrates a cascaded structural diagram of a gate driving circuit according to an embodiment of the present disclosure. Only one shift register unit group in the gate driving circuit is shown in FIG. 10 as an example, and K=4 is exemplarily set in FIG. 10. Therefore, as shown in FIG. 10, the shift register unit group comprises four cascaded shift register units SR1, SR2, SR3, and SR4. Each of these shift register units may be implemented by the shift register unit according to any of the above embodiments.

In FIG. 10, the four cascaded shift register units in each stage of shift register unit group are used to drive adjacent 2×4=8 gate lines, wherein the 8 gate lines comprise a first gate line group to a second gate line group which are arranged in sequence, and each of the gate line groups comprises 4 gate lines arranged in sequence. For example, in FIG. 10, there are two gate line groups, wherein the first gate line group comprises GATE1 to GATE4, and the second gate line group comprises GATE5 to GATE8.

$n^{th}$ output signal terminals of four cascaded shift register units in each shift register unit group are electrically coupled to K gate lines in an $n^{th}$ gate line group in one-to-one correspondence. For example, each of SR1-SR4 comprises a first output signal terminal OUT1, and these four OUT1 are electrically coupled to the four gate lines GATE1 to GATE4 in the first gate line group respectively.

Assuming that the shift register unit group shown in FIG. 10 is a first stage of shift register unit group in the gate driving circuit, except for a first input signal terminal IN1 in SR1, each input signal terminal is electrically coupled to an output signal terminal which is electrically coupled to a previous gate line of a gate line corresponding to the input signal terminal. For example, a first input signal terminal IN1 of SR2 is electrically coupled to an output signal terminal (i.e., OUT1 of SR1) which is electrically coupled to the previous gate line GATE1 of the gate line GATE2 corresponding to the first input signal terminal IN1. As another example, a second input signal terminal IN2 of SR1 is electrically coupled to an output signal terminal (i.e., OUT1 of SR4) which is electrically coupled to the previous gate line GATE4 of the gate line GATE5 corresponding to the second input signal terminal IN2. Here, the gate line corresponding to the input signal terminal refers to a gate line electrically coupled to an output signal terminal corresponding to the input signal terminal. For example, an output signal terminal corresponding to a first input signal terminal IN1 of SR2 is OUT1, the output signal terminal OUT1 is electrically coupled to the gate line GATE2, and therefore a gate line corresponding to the first input terminal IN1 of SR2 is the gate line GATE2.

As an exception, the first input signal terminal IN1 of SR1 is electrically coupled to a frame start signal terminal STV.

As shown in FIG. 10, each shift register unit group is electrically coupled to a first clock signal line CK1 to an eighth clock signal line CK8 (8=2×4 (i.e., N×K)) to receive a first clock signal to an eighth clock signal respectively, and an $m^{th}$ clock signal line and an $m^{th}$ gate line among the eight gate lines driven by the shift register unit group are coupled to the same output sub-circuit, where m=1, 2, ..., 8. For example, both the first clock signal line CK1 and the first gate line GATE1 are electrically coupled to a first output sub-circuit in SR1, that is, the first clock signal line CK1 is electrically coupled to CLK1 of SR1, and the first gate line GATE1 is electrically coupled to OUT1.

In the shift register unit group shown in FIG. 10, each reset signal terminal is electrically coupled to an output signal terminal which is electrically coupled to a next gate line of a gate line driven by an output sub-circuit corresponding to the reset signal terminal. For example, a first reset signal terminal RST1 of SR1 is electrically coupled to an output signal terminal (i.e., OUT1 of SR2) which is electrically coupled to the next gate line GATE2 of the gate line GATE1 driven by the first output sub-circuit in SR1 corresponding to the first reset signal terminal RST1. As another example, a first reset signal terminal RST1 of SR4 is electrically coupled to an output signal terminal (i.e., OUT2 of SR1) which is electrically coupled to the next gate line GATE5 of the gate line GATE4 driven by a first output sub-circuit in SR4 corresponding to the first reset signal terminal RST1.

As an exception, a second reset signal terminal of a last stage of shift register unit in a last stage of shift register unit group of the gate driving circuit is electrically coupled to the frame start signal terminal.

FIG. 11 illustrates a flowchart of a method 1100 for driving a gate driving circuit according to an embodiment of the present disclosure. The method 1100 may be used to drive the gate driving circuit 1000 shown in FIG. 10.

In step S1110, a frame start signal is provided to the first input signal terminal in the first stage of shift register unit in the first stage of shift register unit group.

In step S1120, clock signals are provided to clock signal terminals in each stage of shift register unit group through the N×K (for example, 2×4=8) clock signal lines, wherein a first edge of a clock signal provided through a first clock signal line among the N×K clock signal lines lags behind a first edge of the frame start signal by 1/N×K clock cycles during a first cycle.

In some embodiments, the first clock signal to the $(N×K)^{th}$ clock signal have a duty ratio of 1/N×K, and sequentially lags behind by 1/N×K clock cycles.

FIG. 12 illustrates a schematic block diagram of a display apparatus according to an embodiment of the present disclosure. As shown in FIG. 12, the display apparatus 1200 comprises a gate driving circuit 1210. The gate driving circuit 1210 may be implemented by the gate driving circuit according to any of the embodiments of the present disclosure. The display apparatus 1200 according to the embodiment of the present disclosure may be any product or component having a display function such as an electronic paper, a mobile phone, a tablet computer, a television, a display, a notebook computer, a digital photo frame, a navigator etc.

In the above detailed description, many embodiments have been explained by using schematic diagrams, flowcharts and/or examples. In a case where such schematic diagrams, flowcharts, and/or examples comprise one or more functions and/or operations, it should be understood by those skilled in the art that each function and/or operation in such schematic diagrams, flowcharts, or examples may be realized individually and/or jointly by various structures, hardware, software, firmware, or substantially any combination thereof.

Although the present disclosure has been described with reference to several exemplary embodiments, it should be understood that the terms used are illustrative and exemplary rather than limiting. Since the present disclosure may be embodied in various forms without departing from the spirit or essence of the present disclosure, it should be understood that the above embodiments are not limited to any of the foregoing details, but should be widely interpreted within the spirit and scope defined by the appended claims. Therefore, all changes and variations falling within the scope of the claims or their equivalents should be covered by the appended claims. Various modifications and changes may be made within the scope. The scope of the present disclosure is limited only by the appended claims.

We claim:

1. A shift register unit, comprising a first input sub-circuit to an $N^{th}$ input sub-circuit, a first output sub-circuit to an $N^{th}$ output sub-circuit which have one-to-one correspondence with the first input sub-circuit to the $N^{th}$ input sub-circuit, and a control sub-circuit, where N is an integer greater than or equal to 2, wherein an $n^{th}$ input sub-circuit is electrically coupled to an $n^{th}$ input signal terminal, a first level signal terminal and a pull-up node, and is configured to transmit a first level signal at the first level signal terminal to the pull-up node under the control of an $n^{th}$ input signal at the $n^{th}$ input signal terminal, an $n^{th}$ output sub-circuit is electrically coupled to an $n^{th}$ clock signal terminal, the pull-up node, and an $n^{th}$ output signal terminal, and is configured to transmit an $n^{th}$ clock signal at the $n^{th}$ clock signal terminal to the $n^{th}$ output signal terminal under the control of a voltage at the pull-up node, where n=1, 2, ..., N, the control sub-circuit is electrically coupled to the pull-up node, a second level signal terminal, a third level signal terminal, and a pull-down node, and is configured to transmit a second level signal at the second level signal terminal or a third level signal at the third level signal terminal to the pull-down node under the control of the voltage at the pull-up node.

2. The shift register unit according to claim 1, further comprising a first pull-down sub-circuit to an $N^{th}$ pull-down sub-circuit which have one-to-one correspondence with the first output sub-circuit to the $N^{th}$ output sub-circuit, wherein an $n^{th}$ pull-down sub-circuit is electrically coupled to a pull-down node, a second level signal terminal and the $n^{th}$ output signal terminal, and is configured to transmit a second level signal at the second level signal terminal to the $n^{th}$ output signal terminal under the control of a voltage at the pull-down node.

3. The shift register unit according to claim 1, wherein the control sub-circuit comprises a first control transistor and a second control transistor, wherein the first control transistor has a control electrode and a first electrode electrically coupled to the third level signal terminal, and a second electrode electrically coupled to the pull-down node, and the second control transistor has a control electrode electrically coupled to the pull-up node, a first electrode electrically coupled to the second level signal terminal, and a second electrode electrically coupled to the pull-down node.

4. The shift register unit according to claim 3, wherein the control sub-circuit further comprises a third control transistor, wherein the third control transistor has a control electrode electrically coupled to the pull-down node, a first electrode electrically coupled to the second level signal terminal, and a second electrode electrically coupled to the pull-up node.

5. The shift register unit according to claim 1, further comprising a first reset sub-circuit to an $N^{th}$ reset sub-circuit which have one-to-one correspondence with the first output sub-circuit to the $N^{th}$ output sub-circuit, wherein an $n^{th}$ reset sub-circuit is electrically coupled to an $n^{th}$ reset signal terminal, a second level signal terminal, and the pull-up node, and is configured to transmit a second level signal at the second level signal terminal to the pull-up node under the control of an $n^{th}$ reset signal at the $n^{th}$ reset signal terminal.

6. The shift register unit according to claim 5, wherein the $n^{th}$ reset sub-circuit comprises an $n^{th}$ reset transistor, wherein the $n^{th}$ reset transistor has a control electrode electrically coupled to the $n^{th}$ reset signal terminal, a first electrode electrically coupled to the second level signal terminal, and a second electrode electrically coupled to the pull-up node.

7. The shift register unit according to claim 1, further comprising a general reset sub-circuit, wherein the general reset sub-circuit is electrically coupled to a general reset signal terminal, a second level signal terminal and the pull-up node, and is configured to transmit a second level signal at the second level signal terminal to the pull-up node under the control of a general reset signal at the general reset signal terminal.

8. The shift register unit according to claim 7, wherein the general reset sub-circuit comprises a general reset transistor, wherein the general reset transistor has a control electrode electrically coupled to the general reset signal terminal, a first electrode electrically coupled to the second level signal terminal, and a second electrode electrically coupled to the pull-up node.

9. The shift register unit according to claim 1, further comprising an external compensation driving sub-circuit, wherein the external compensation driving sub-circuit is electrically coupled to a compensation input signal terminal, a random output enabling signal terminal, a compensation clock signal terminal, a second level signal terminal and the pull-up node, and is configured to transmit a compensation clock signal at the compensation clock signal terminal to the pull-up node under the control of a random output enabling signal at the random output enabling signal terminal and the compensation clock signal.

10. The shift register unit according to claim 9, wherein the external compensation driving sub-circuit comprises a first compensation driving transistor, a second compensation driving transistor, a third compensation driving transistor, and a compensation driving capacitor, wherein the first compensation driving transistor has a control electrode electrically coupled to the random output enabling signal terminal, a first electrode electrically coupled to the compensation input signal terminal, and a second electrode electrically coupled to a first electrode of the compensation driving capacitor, the second compensation driving transistor has a control electrode electrically coupled to the first electrode of the compensation driving capacitor, a first electrode electrically coupled to the compensation clock signal terminal, and a second electrode electrically coupled to a first electrode of the third compensation driving transistor, the third compensation driving transistor has a control electrode electrically coupled to the compensation clock signal terminal, and a second electrode electrically coupled to the pull-up node, and a second electrode of the compensation driving capacitor is electrically coupled to the second level signal terminal.

11. The shift register unit according to claim 1, wherein the $n^{th}$ input sub-circuit comprises an $n^{th}$ input transistor, wherein the $n^{th}$ input transistor has a control electrode electrically coupled to the $n^{th}$ input signal terminal, a first electrode electrically coupled to the first level signal terminal, and a second electrode electrically coupled to the pull-up node.

12. The shift register unit according to claim 1, wherein the $n^{th}$ output sub-circuit comprises an $n^{th}$ output transistor and an $n^{th}$ storage capacitor, wherein the $n^{th}$ output transistor has a control electrode electrically coupled to the pull-up node, a first electrode electrically coupled to the $n^{th}$ clock signal terminal, and a second electrode electrically coupled to the $n^{th}$ output signal terminal, and the $n^{th}$ storage capacitor has a first electrode electrically coupled to the pull-up node, and a second electrode electrically coupled to the $n^{th}$ output signal terminal.

13. The shift register unit according to claim 2, wherein the $n^{th}$ pull-down sub-circuit comprises an $n^{th}$ pull-down transistor, wherein the $n^{th}$ pull-down transistor has a control electrode electrically coupled to the pull-down node, a first electrode electrically coupled to the second level signal terminal, and a second electrode electrically coupled to the $n^{th}$ output signal terminal.

14. A method for driving the shift register unit according to claim 1, wherein each frame comprises a first driving period to an $N^{th}$ driving period, the method comprising:

during an $n^{th}$ driving period, performing driving through the $n^{th}$ input sub-circuit and the $n^{th}$ output sub-circuit, wherein the $n^{th}$ driving period comprises an $n^{th}$ input period and an $n^{th}$ output period, wherein during the $n^{th}$ input period, charging the pull-up node to a first valid level through the $n^{th}$ input sub-circuit; and during the $n^{th}$ output period, transmitting the $n^{th}$ clock signal to the $n^{th}$ output signal terminal under the control of the voltage at the pull-up node.

15. The method according to claim 14, wherein each frame further comprises a blank period following the first driving period to the $N^{th}$ driving period, and wherein the shift register unit further comprises an external compensation driving sub-circuit, wherein the external compensation driving sub-circuit comprises a first compensation driving transistor, a second compensation driving transistor, a third compensation driving transistor, and a compensation driving capacitor, wherein the first compensation driving transistor has a control electrode electrically coupled to a random output enabling signal terminal, a first electrode electrically coupled to a compensation input signal terminal, and a second electrode electrically coupled to a first electrode of the compensation driving capacitor, the second compensation driving transistor has a control electrode electrically coupled to the first electrode of the compensation driving capacitor, a first electrode electrically coupled to a compensation clock signal terminal, and a second electrode electrically coupled to a first electrode of the third compensation driving transistor, the third compensation driving transistor has a control electrode electrically coupled to the compensation clock signal terminal, and a second electrode electrically coupled to the pull-up node, and a second electrode of the compensation driving capacitor is electrically coupled to a second level signal terminal, and the method further comprises:

during a random one of the first output period to the $N^{th}$ output period, turning the second compensation driving transistor on by a compensation input signal at the compensation input signal terminal under the control of a random output enabling signal, during the blank period, raising the pull-up node to a valid level by a compensation clock signal, so as to transmit a first clock signal to an $N^{th}$ clock signal to the first output signal terminal to the $N^{th}$ output signal terminal respectively; and causing one of the first clock signal to the $N^{th}$ clock signal to have a high level during at least a part of the blank period according to the random output enabling signal, to enable one of the first output signal terminal to the $N^{th}$ output signal terminal to output a high level signal during the blank period.

16. A gate driving circuit comprising a plurality of cascaded shift register unit groups, each shift register unit group comprising K cascaded shift register units, wherein each of the shift register units is the shift register unit according to claim 1, where K is an integer greater than or equal to 3, wherein K cascaded shift register units in each stage of shift register unit group are used to drive adjacent N×K gate lines, wherein the N×K gate lines comprise a first gate line group to an $N^{th}$ gate line group which are arranged in sequence, and each gate line group comprises K gate lines arranged in sequence, wherein $n^{th}$ output signal terminals in the K cascaded shift register units in each shift register unit group are electrically coupled to K gate lines in an $n^{th}$ gate line group in one-to-one correspondence respectively, except for a first input signal terminal of a first shift register unit in a first shift register unit group, each input signal terminal is electrically coupled to an output signal terminal which is electrically coupled to a previous gate line of a gate line corresponding to the input signal terminal, and the first input signal terminal of the first shift register unit in the first shift register unit group is electrically coupled to a frame start signal terminal.

17. The gate driving circuit according to claim 16, wherein each shift register unit group in the gate driving circuit is electrically coupled to a first clock signal line to an $(N×K)^{th}$ clock signal line to receive a first clock signal to an $(N×K)^{th}$ clock signal respectively, wherein an $m^{th}$ clock signal line and an $m^{th}$ gate line among N×K gate lines driven by the shift register unit group are coupled to the same output sub-circuit, where m=1, 2, . . . , N×K.

18. A method for driving the gate driving circuit according to claim 16, comprising:

providing a frame start signal to the first input signal terminal in the first register unit in the first shift register unit group; and providing clock signals to clock signal terminals in each shift register unit group through N×K clock signal lines, wherein a first edge of a clock signal provided through a first clock signal line among the N×K clock signal lines lags behind a first edge of the frame start signal by 1/N×K clock cycles during a first cycle.

19. A display apparatus comprising the gate driving circuit according to claim 16.

* * * * *